(12) United States Patent
Subat et al.

(10) Patent No.: US 8,861,209 B2
(45) Date of Patent: Oct. 14, 2014

(54) ELECTROMAGNETIC SHIELD

(71) Applicant: Bose Corporation, Framingham, MA (US)

(72) Inventors: Brad Subat, Northborough, MA (US); Daniel Hodgkins, Princeton, MA (US)

(73) Assignee: Bose Corporation, Framingham, MA (US)

( * ) Notice: Subject to any disclaimer, the term of this patent is extended or adjusted under 35 U.S.C. 154(b) by 143 days.

(21) Appl. No.: 13/756,909

(22) Filed: Feb. 1, 2013

(65) Prior Publication Data

US 2014/0218876 A1  Aug. 7, 2014

(51) Int. Cl.
*H05K 5/00* (2006.01)
*H05K 9/00* (2006.01)

(52) U.S. Cl.
CPC ..................... *H05K 9/002* (2013.01)
USPC ............ 361/752; 361/748; 361/736; 174/377

(58) Field of Classification Search
USPC ........................... 361/752, 748, 736; 174/377
See application file for complete search history.

(56) References Cited

U.S. PATENT DOCUMENTS

2004/0172502 A1* 9/2004 Lionetta et al. ................ 711/112
2012/0307436 A1* 12/2012 Dickens et al. ........... 361/679.02

* cited by examiner

*Primary Examiner* — Andargie M Aychillhum

(57) ABSTRACT

In an aspect, in general, an apparatus includes an electrically conductive housing including a first portion and second portion, the first portion including electronic circuitry. An electromagnetic shield separates the first portion and the second portion and is configured to electromagnetically isolate the electronic circuitry of the first portion from the second portion. The electromagnetic shield includes a plurality of electrically conductive walls partially separating the first portion and the second portion, a plurality of electrically conductive spring loaded fingers extending from an end of at least one of the plurality of electrically conductive walls and configured to contact an inner surface of the housing. Together, the plurality of electrically conductive walls and the plurality of electrically conductive spring loaded fingers separate the first portion and the second portion.

18 Claims, 6 Drawing Sheets

ELECTROMAGNETIC SHIELD

BACKGROUND

This invention relates to electromagnetic shielding.

Electromagnetic shielding is the practice of limiting the amount of electromagnetic radiation that enters or is emitted from a given space. In some examples, electromagnetic shields are used to isolate sensitive electronic circuitry from electromagnetic radiation. In other examples, electromagnetic shields are used to limit the amount of electromagnetic radiation that is emitted from electronic circuitry into a surrounding environment (e.g., to satisfy government regulations). One common example of an electromagnetic shield is a Faraday cage which generally is in the form of an enclosure having a mesh of conductive material. In general, an electrical field outside of a Faraday cage causes electric charges within the conductive material of a Faraday cage to redistribute such that the effects of the electrical field are cancelled within the interior of the Faraday cage.

SUMMARY

In an aspect, in general, an apparatus includes an electrically conductive housing including a first portion and second portion, the first portion including electronic circuitry. An electromagnetic shield separates the first portion and the second portion and is configured to electromagnetically isolate the electronic circuitry of the first portion from the second portion. The electromagnetic shield includes a plurality of electrically conductive walls partially separating the first portion and the second portion, a plurality of electrically conductive spring loaded fingers extending from an end of at least one of the plurality of electrically conductive walls and configured to contact an inner surface of the housing. Together, the plurality of electrically conductive walls and the plurality of electrically conductive spring loaded fingers separate the first portion and the second portion.

Aspects may include one or more of the following features.

The housing may include a connector wall including one or more openings between the second portion of the housing and an outside environment. Each of the plurality of electrically conductive spring fingers may extend away from the connector wall of the housing at a predetermined angle, θ. The spring loaded fingers may have a serpentine cross-sectional shape. A first portion of each of the plurality of spring fingers may protrude into the first portion of the housing by a predetermined amount and a second portion of each of the plurality of spring fingers may protrude into the second portion of the housing by a predetermined amount.

At least a portion of each of the plurality of spring fingers may protrude into the first portion of the housing. Each of the plurality of electrically conductive spring fingers may include a first spring finger portion extending from the at least one electrically conductive wall in a direction away from the connector wall of the housing at a predetermined angle, $\theta_1$, and a second spring finger portion extending from an end of the first spring finger portion in a direction toward the connector wall of the housing at a predetermined angle, $\theta_2$.

A first portion of each of the plurality of spring fingers may protrude into the first portion of the housing by a predetermined amount and a second portion of each of the plurality of spring fingers may protrude into the second portion of the housing by a predetermined amount. One or more electrical connectors may extend from the second portion, through the openings in the connector wall of the housing and into the outside environment. The electrically conductive housing may house a printed circuit board for supporting electronic circuitry. The electromagnetic shield may include one or more electrically conductive anchors for anchoring the electromagnetic shield to the printed circuit board.

The spring loaded fingers may be configured to reduce transmission of forces from the housing into the printed circuit board. The plurality of electrically conductive walls of the electromagnetic shield may include a first wall facing the connector wall, a second wall extending perpendicularly from a first end of the first wall and toward the connector wall, and a third wall extending perpendicularly from a second end of the first wall and toward the connector wall. The spring fingers may extend from the first wall. The spring fingers may extend from the second wall. The spring fingers may extend from the third wall. The spring fingers may extend from the first, second, and third walls. The second portion may include electronic circuitry.

Embodiments may have one or more of the following advantages.

Among other advantages, embodiments of the electromagnetic shield described above advantageously reduce the amount of force and torque that might be otherwise applied to a printed circuit board both during and after assembly of the printed circuit board into a housing. This is an improvement over some conventional electromagnetic shields which transmit excessive forces from the housing to the printed circuit board, causing torque to be applied to the printed circuit board. Such an application of torque to the printed circuit board can potentially break or fracture solder joints and damage electronic components (e.g., brittle ceramic capacitors) mounted on the printed circuit board.

Embodiments of the electromagnetic shield described above advantageously allow for more complete conformal coating of the printed circuit board in the vicinity of the electromagnetic shield by reducing the amount of the printed circuit board that is covered by the shield. This is an improvement over some conventional electromagnetic shields which enclose portions of the printed circuit board such that conformal coating can not be sprayed onto the portions of the printed circuit board, possibly resulting in dendrite growth problems.

Embodiments of the electromagnetic shield described above include spring fingers which can conform to irregularities in the shape of the inside surface of the housing. This is an improvement over some conventional electromagnetic shields which include only a single, solid element for contacting the inside surface of the housing in that the single, solid element could potentially make contact with the inside surface of the housing in only a single place. Such a situation results in an uneven application of forces to the printed circuit board and degraded electromagnetic shielding capabilities.

Other features and advantages of the invention are apparent from the following description, and from the claims.

DESCRIPTION

1 Overview

Figure 1:
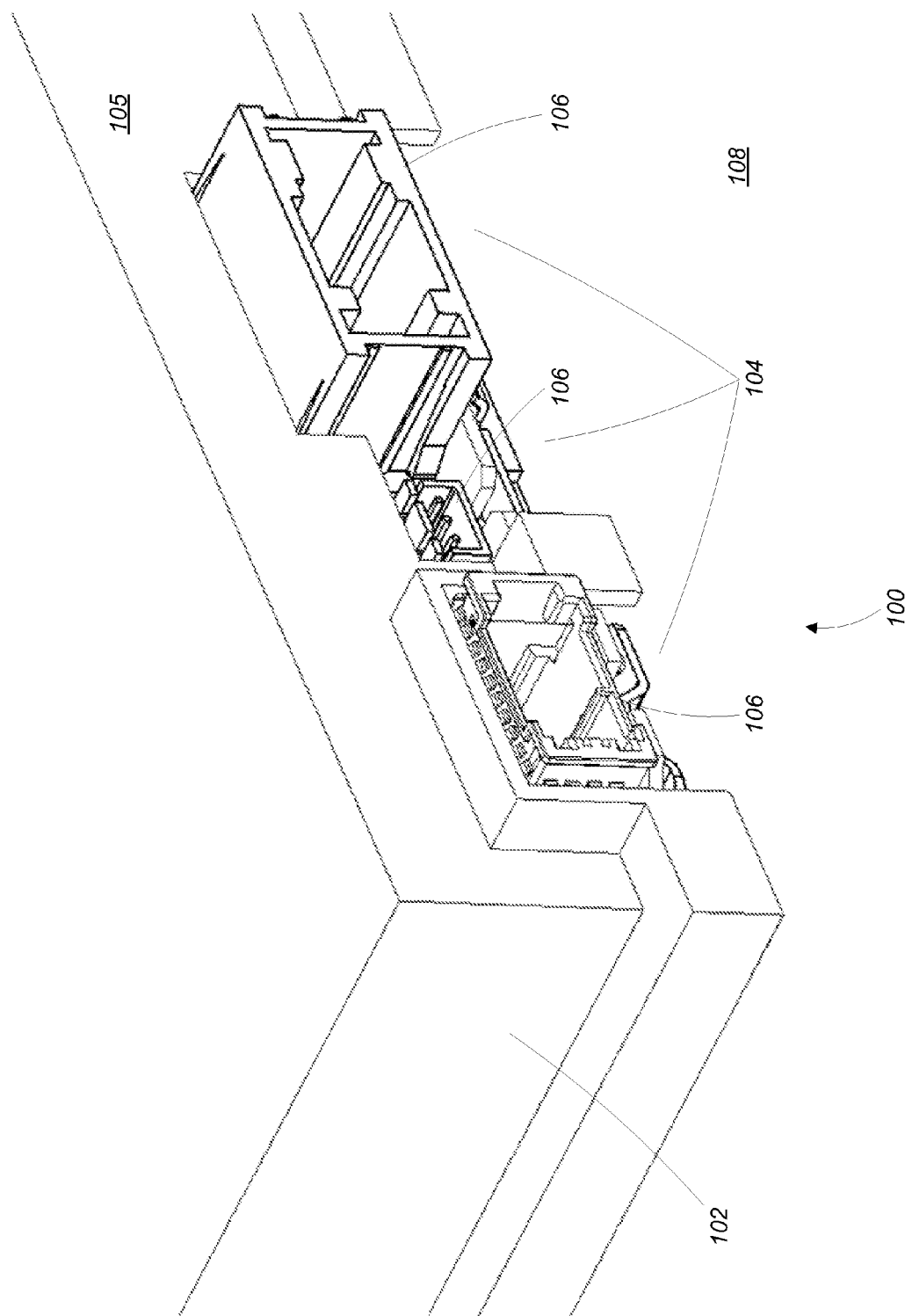
FIG. 1 is an electronic device for enclosing electronic circuitry.

Referring to FIG. 1, an electronic device 100 includes an electrically conductive housing 102 which encloses electronic circuitry (not shown). The housing 102 includes a connector wall 105 which includes one or more openings 104.

A number of connectors 106 extend from an inside of the housing 102, through the one or more openings 104, and to an outside environment 108. In general, the connectors 106 are configured to receive various types of cables (not shown) which can be used to connect the electronic circuitry to various other devices and power sources. For example, certain cables can be connected to certain connectors 106 for the purpose of supplying power to the electronic circuitry. Other cables can be connected to certain connectors 106 for the purpose of providing input signals (e.g., audio input signals) to the electronic circuitry. Yet other cables can be connected to certain connectors 106 for the purpose of providing output signals (e.g., audio output signals) from the electronic circuitry to external devices (e.g., loudspeaker elements).

The openings 104 potentially expose at least a portion of the electronic circuitry within the housing 102 to the outside environment 108. Exposure of electronic circuitry within the housing 102 can be problematic when electromagnetic radiation is present in the outside environment 108. In particular, electromagnetic radiation present in the outside environment 108 can enter the housing 102 and interfere with the operation of the electronic circuitry. Conversely, electromagnetic radiation produced by the electronic circuitry of the device 100 can be emitted from the openings 104. Thus, there is a need for an electromagnetic shield for isolating the electronic circuitry from the outside environment 108 and vice versa.

Figure 2:
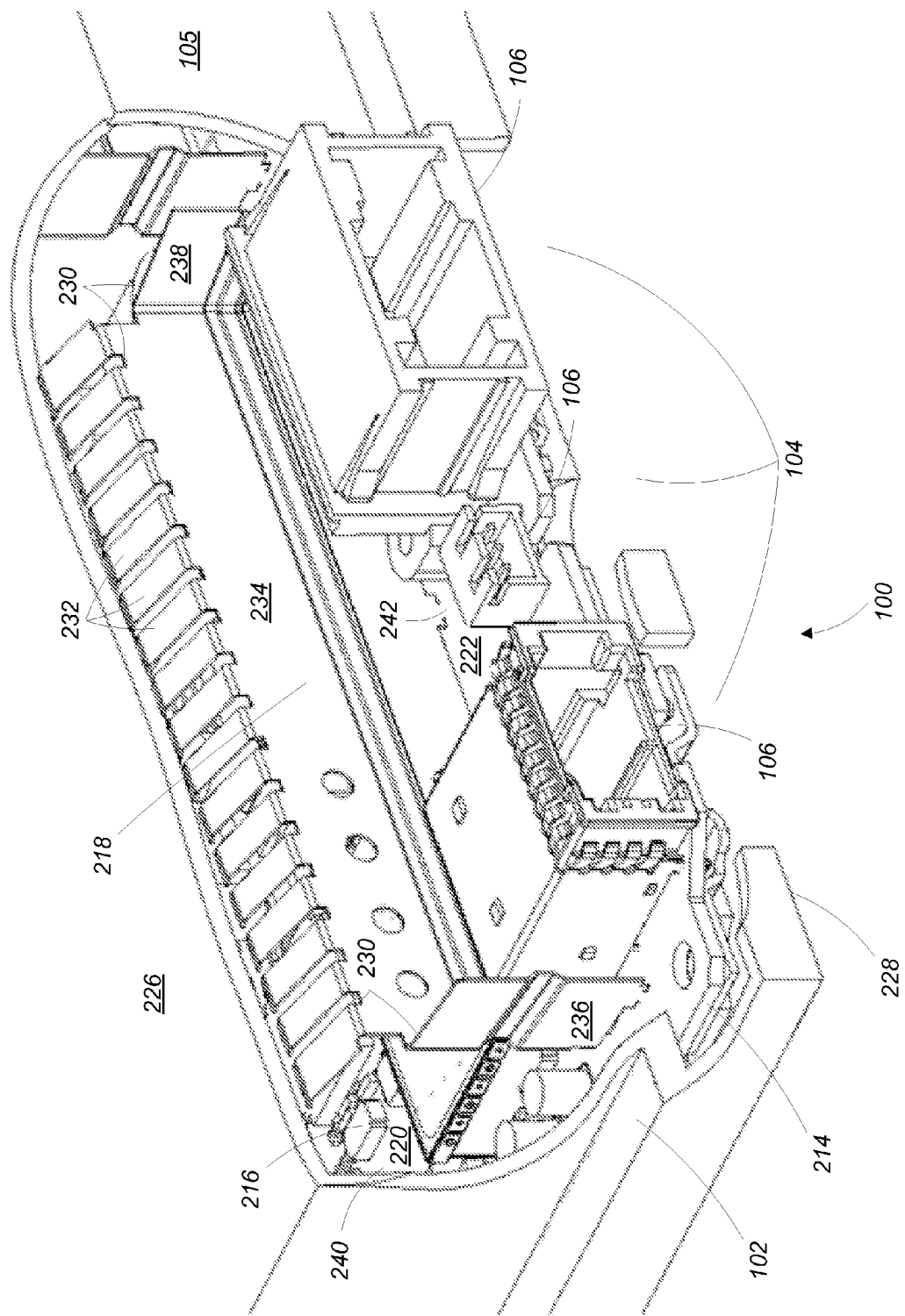
FIG. 2 is a cut-away view of the inside of the electronic device of FIG. 1.

Referring to FIG. 2, a cutaway view of the electronic device 100 has a portion of the housing 102 cut away such that an interior of the housing 102 is visible. It is noted that FIG. 2 is cut away for illustrative purposes only and does not represent a physical removal of material from the housing 102.

The interior of the housing 102 includes a printed circuit board 214 which mechanically and electrically supports electronic circuitry 216. The connectors 106 and an electromagnetic shield 218 are also mounted to the printed circuit board 214. The connectors 106 include electrical contacts which facilitate electrical connections with the electronic circuitry 216.

The electromagnetic shield 218 is mounted to the printed circuit board 214 such that it separates a first volume 220 within the housing 102 from a second volume 222 within the housing 102. The second volume 222 is exposed to the outside environment 108 through the openings 104 in connector wall 105 of the housing 102.

The combination of the electromagnetic shield 218, the housing 102, and the printed circuit board 214 limits the exposure of the electronic circuitry 216 in the first volume 220 to electromagnetic radiation from the outside environment 108. The combination of the electromagnetic shield 218, the housing 102, and the printed circuit board 214 also limits the amount of electromagnetic radiation emitted by the electronic circuitry 216 in the first volume 220 of the housing 102 that is emitted into the outside environment 108.

The electromagnetic shield 218 includes a number of walls which are mounted to the printed circuit board 214 such that the electromagnetic shield 218 is grounded through a chassis ground of the housing 102. In some examples, the mounted walls extend perpendicularly from the printed circuit board 214 in a direction from a bottom of the housing 228 to a top surface 226 of the housing 102. In some examples the electromagnetic shield 218 includes three walls: a first wall 234 which is set back from and faces the connector wall 105 of the housing 102, and second and third walls 236, 238 extending perpendicularly from opposing ends of the first wall 234 and in a direction toward the connector wall 105 of the housing 102. A plurality of spring loaded members, or "spring fingers" 232 extend from a top 230 of one or more of the walls 234, 236, 238 and toward the top surface 226 of the housing 102. Each spring finger 232 establishes an electrical connection with an inner surface of the top surface 226 of the housing 102. In some examples, the spring fingers 232 extend from the top 230 of one or more or of the walls 234, 236, 238 at an angle, $\theta$, and in a direction away from the connector wall 105 of the housing 102. In other examples, depending on the geometry of the interior of the housing and/or the geometry of the printed circuit board 214, the spring fingers 232 may extend from the top 230 of one or more or of the walls 234, 236, 238 at an angle, $\theta$, and in a direction toward the connector wall 105 of the housing 102.

In this way, the top surface 226 of the housing 102, the electromagnetic shield 218, and a portion of the printed circuit board 214 collectively form an electromagnetic shield enclosure which minimizes the amount of electromagnetic radiation that passes into or out of the first volume 220 (including the electronic circuitry 216) through the second volume 222.

2 Electromagnetic Shield

Figure 3:
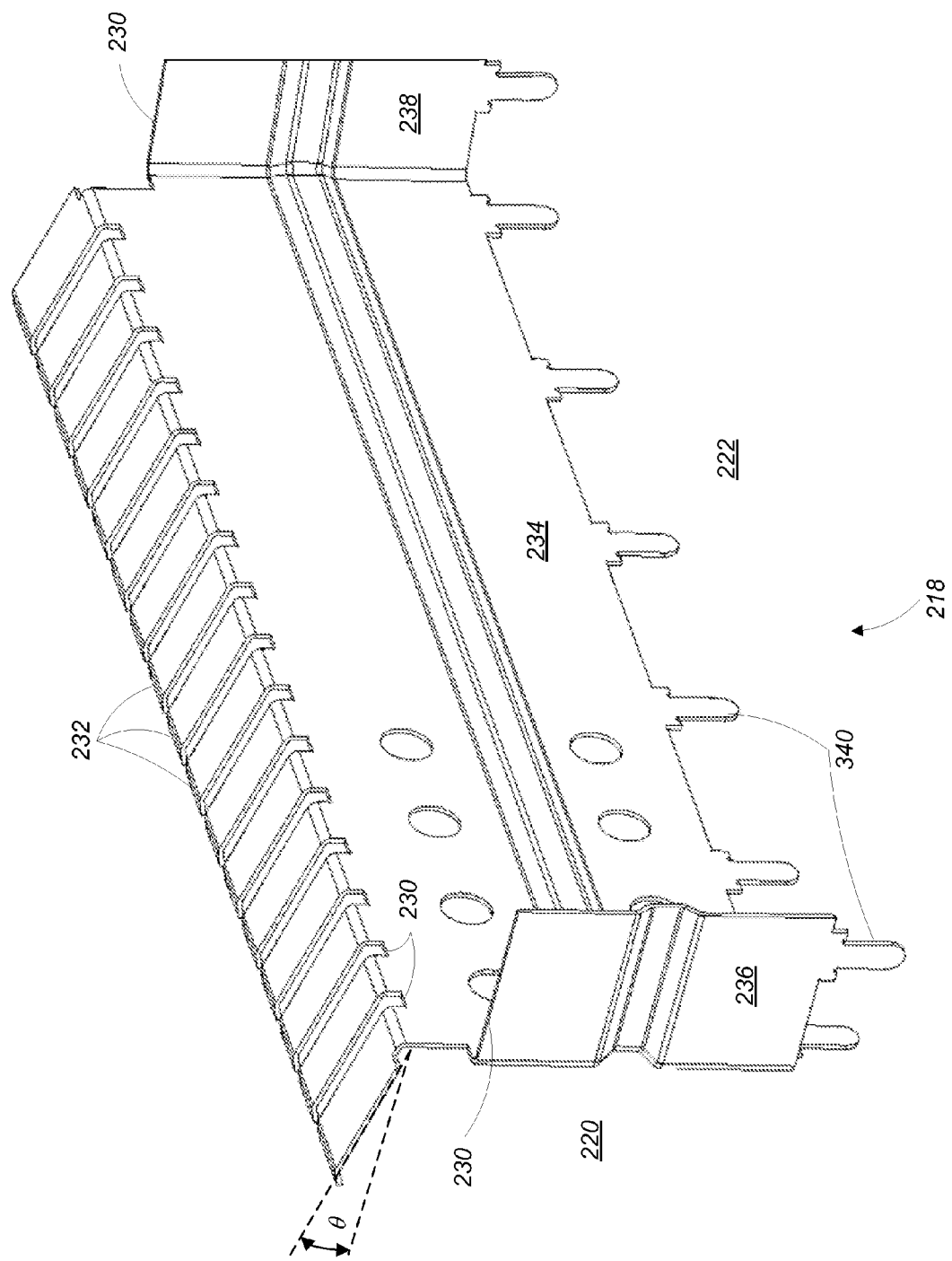
FIG. 3 is an isometric view of a first embodiment of an electromagnetic shield.

Referring to FIGS. 2 and 3, the electromagnetic shield 218 includes three walls 234, 236, 238. Each wall includes one or more electrically conductive anchors 340 for anchoring the shield 218 to the printed circuit board 214. A central wall 234 of the three walls includes a number of spring fingers 232. When the electromagnetic shield 218 is mounted to the printed circuit board 214, the anchors 340 establish an electrical connection with the chassis ground of the housing 102.

In addition to the electromagnetic shielding functionality described above, the electromagnetic shield 218 is configured to serve a number of other purposes, including but not limited to: facilitating spraying of conformal coating of the printed circuit board 214, preventing application of excess torque to the printed circuit board 214, and establishing multiple points of contact with the inner surface of the top surface 226 of the housing 102.

Conformal coating is a material that is applied electronic circuitry to protect the circuitry from being damaged by moisture, dust, chemicals, and extreme temperatures. One common method for applying conformal coating to electronic circuitry includes spraying a liquid form of the conformal coating onto the electronic circuitry and causing the conformal coating to harden on the electronic circuitry (e.g., by a curing or drying step). To facilitate spraying of conformal coating onto the portion 242 of the printed circuit board 214 located in the second volume 222, the spring fingers 232 extend from the top 230 of one or more of the walls 234, 236, 238 in a direction away from the connector wall 105 of the housing 102 such that the spring fingers 232 do not hang over the portion 242 of the printed circuit board 214 located in the second volume 222 (i.e., the spring fingers 232 only hang over the portion 240 of the printed circuit board 214 located in the first volume 220). In this way, the portion 242 of the printed circuit board 214 that is located in the second volume 222 is entirely exposed to the spray of a downward facing conformal coating spray nozzle. In some examples, the amount that the spring fingers 232 overhang the portion 240 of the printed circuit board 214 located in the first volume 220 is specified such that conformal coating spray nozzles, some of which can spray conformal coating at an angle (e.g., 30 degrees), are able to spray conformal coating on the entire portion 240 of the printed circuit board including the portions of the printed circuit board under the overhanging portions of the spring fingers 232.

In other examples, depending on geometric constraints of the interior of the housing 102, the spring fingers 232 extend from the top 230 of one or more of the walls 234, 236, 238 in a direction toward the connector wall 105 of the housing such that the spring fingers 232 do not overhang the portion 240 of the printed circuit board 214 located in the first volume 220.

To prevent the application of excess torque to the printed circuit board 214, the spring fingers 232 extend from the top 230 of one or more of the walls 234, 236, 238 at an angle, θ, relative to the printed circuit board 214. The angle of extension of the spring fingers 232 causes the spring fingers 232 to be compliant. In operation (i.e, during and after installation of the printed circuit board 214 into the housing 102) the housing 102 exerts forces on the spring fingers 232, which in turn comply to absorb the forces. By absorbing the forces exerted by the housing 102, the spring fingers 232 substantially prevent the forces from being transmitted to the printed circuit board 214, thereby substantially preventing torque from being applied to the printed circuit board 214 via the shield 218.

To establish multiple points of contact with the inner surface of the top surface 226 of the housing 102, each of the spring fingers 232 interacts independently with the inner surface of the top surface 226 of the housing 102. Thus, if the inside of the top surface 226 housing 102 has an irregular (e.g., bowed) shape, the spring fingers conform to the irregular shape, absorbing the forces applied by the housing 214 and effectively electromagnetically isolating the first volume 220 from the second volume 222.

3 Alternative Embodiments

Figure 4:
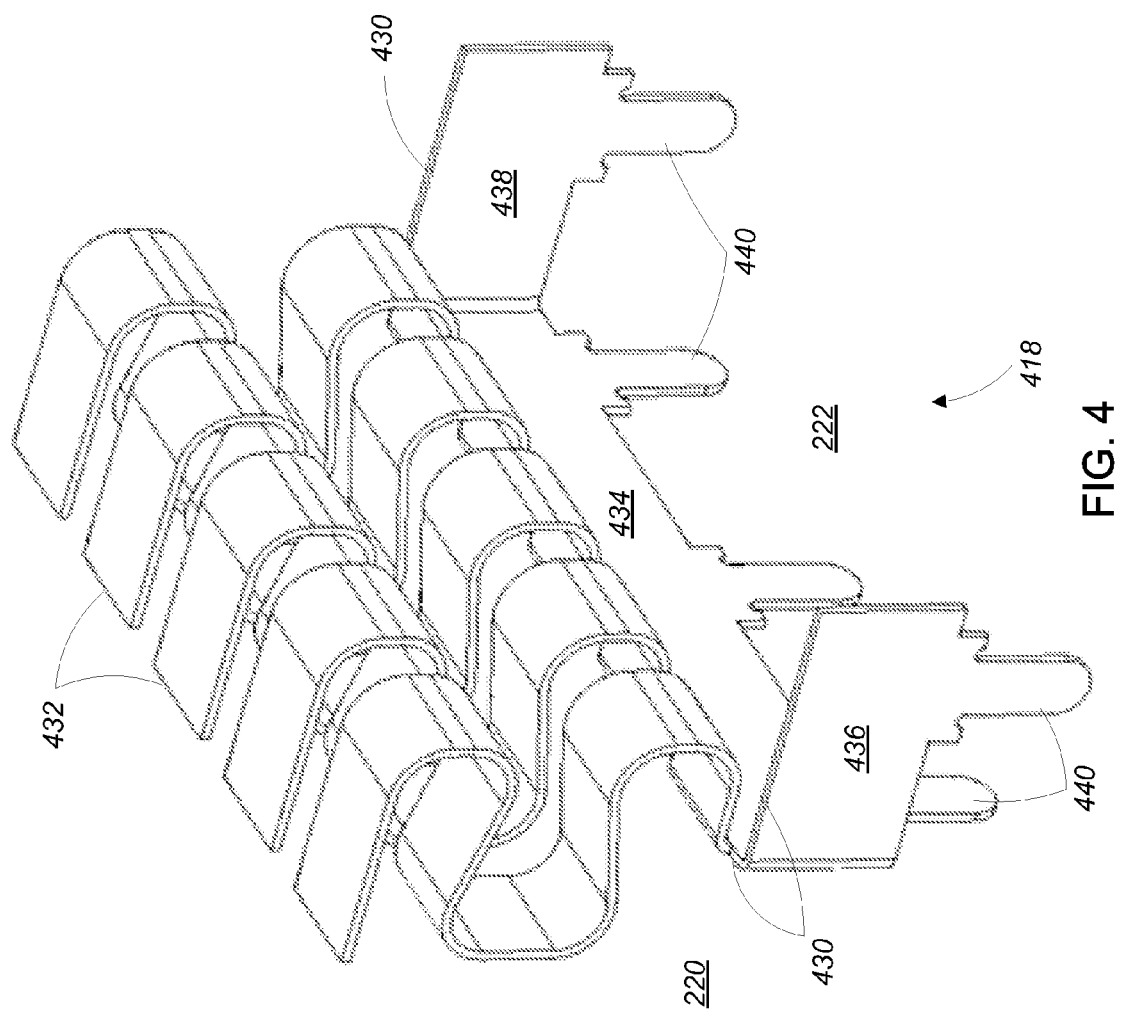
FIG. 4 is an isometric view of a second embodiment of an electromagnetic shield.

Referring to FIG. 4, a second embodiment of an electromagnetic shield 418 includes three walls 434, 436, 438, each including one or more electrically conductive anchors 440 for anchoring the shield 418 to a printed circuit board (e.g., the printed circuit board 214 of FIG. 2). A central wall 434 of the three walls includes a number of spring fingers 432.

The spring fingers 432 of the electromagnetic shield 418 have an accordion-like (i.e., serpentine) cross sectional shape. The cross-sectional shape of the spring fingers 432 configures the spring fingers 432 such that they conform to geometric constraints of the interior of the housing 102 (e.g., space restrictions both in the first volume 220 and the second volume 222) and provide additional compliance when compared to other embodiments of the spring fingers 432. In some examples, certain portions of the spring fingers 432 overhang a portion (e.g., element 240 of FIG. 2) of the printed circuit board in the first volume 220 and other portions of the spring fingers 432 overhang a portion (e.g., element 242 of FIG. 2) of the printed circuit board in the second volume 222. In such cases, the amount of overhang is specified such that conformal coating spray nozzles, some of which can spray conformal coating conically (e.g., at an angle of 30 degrees), are able to spray conformal coating on the entire printed circuit board including the portions of the printed circuit board under the overhanging portions of the spring fingers 432. In some examples, the electromagnetic shield 418 applies little to no torque to the printed circuit board.

Figure 5:
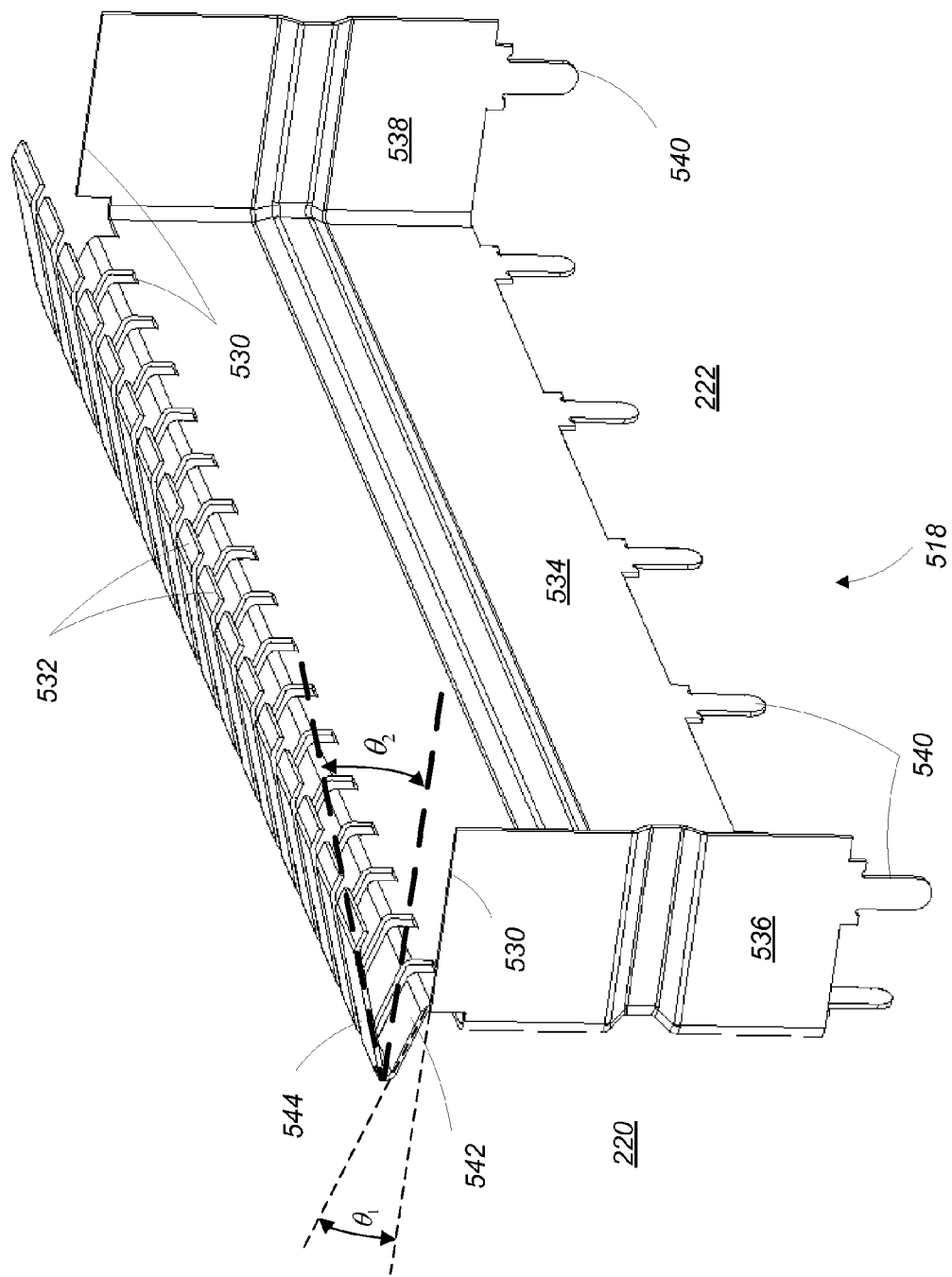
FIG. 5 is an isometric view of a third embodiment of an electromagnetic shield.

Referring to FIG. 5, another embodiment of electromagnetic shield 518 includes three walls 534, 536, 538, each including one or more electrically conductive anchors 540 for anchoring the shield 518 to a printed circuit board (e.g., the printed circuit board 214 of FIG. 2). A central wall 534 of the three walls includes a number of spring fingers 532.

The spring fingers 532 of the electromagnetic shield 518 include a first portion 542 which extends from a top 530 of one or more of the walls and away from a connector wall (e.g., the connector wall 105 of FIG. 1) at a first angle, $\theta_1$, relative to the printed circuit board 214. A second portion 542 of the spring fingers 532 extends from an end of the first portion 542 and toward the second volume 222 at a second angle, $\theta_2$, relative to the printed circuit board 214. In general, the shape of the spring fingers 532 configures the spring fingers 542 such that they conform to geometric constraints of the interior of the housing 102 and provide additional compliance when compared to other embodiments of the spring fingers 532. The shape of the spring fingers 532 causes certain portions of the spring fingers 532 overhang a portion (e.g., element 240 of FIG. 2) of the printed circuit board 214 in the first volume 220 and other portions of the spring fingers 532 overhang a portion (e.g., element 242 of FIG. 2) of the printed circuit board 214 in the second volume 222. In such cases, the amount of overhang is specified such that conformal coating spray nozzles, some of which can spray conformal coating at an angle (e.g., 30 degrees), are able to spray conformal coating on the entire printed circuit board including the portions of the printed circuit board under the overhanging portions of the spring fingers 532.

In some examples, an amount that the spring fingers 532 overhang the portion of the printed circuit board 214 in the first volume 220 is less than an amount that the spring fingers 232 overhang the portion of the printed circuit board 214 in the second volume 222. In other examples, the amount that the spring fingers 532 overhang the portion of the printed circuit board 214 in the first volume 220 is greater than an amount that the spring fingers 232 overhang the portion of the printed circuit board 214 in the second volume 222.

Figure 6:
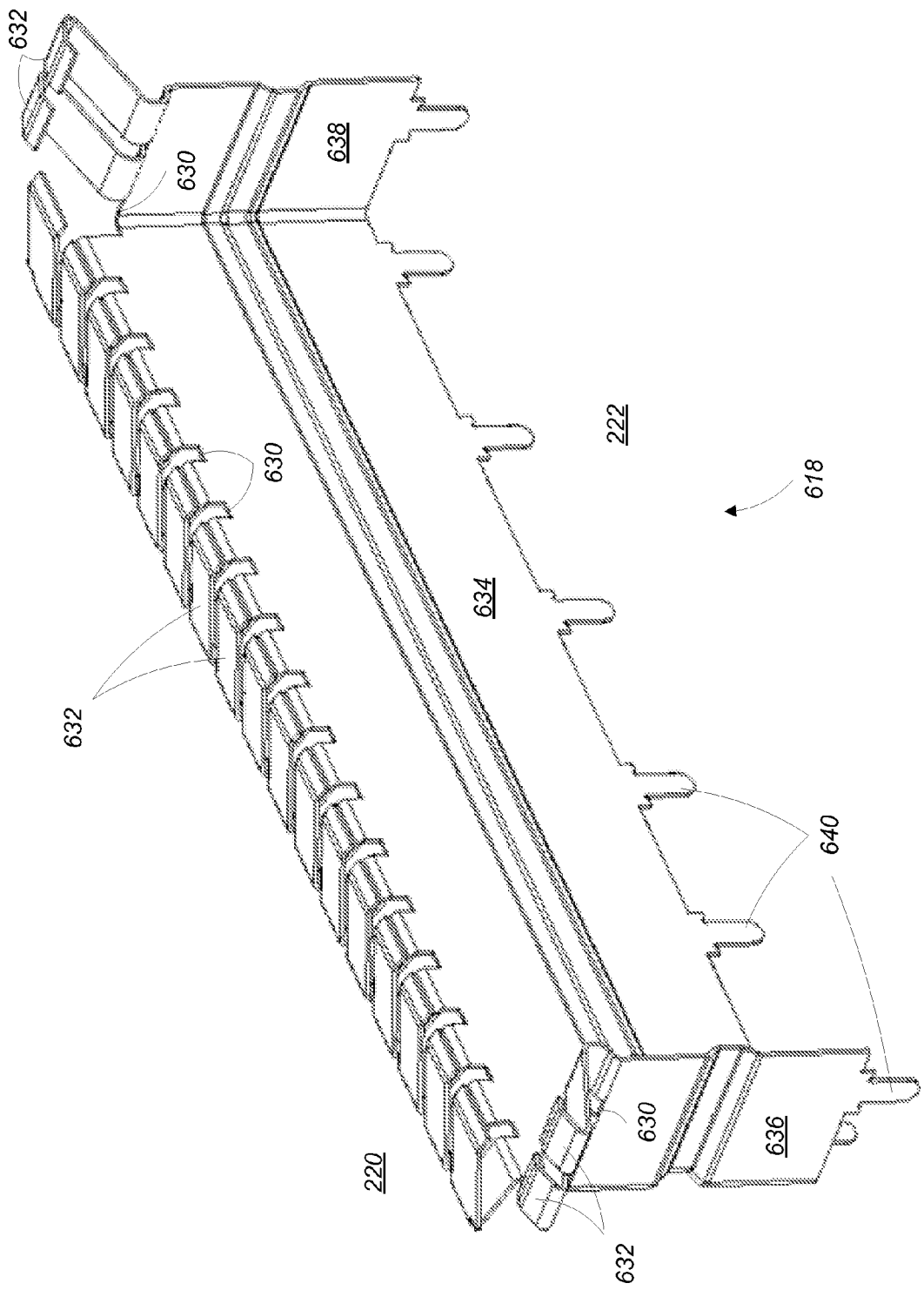
FIG. 6 is an isometric view of a fourth embodiment of an electromagnetic shield.

Referring to FIG. 6, another embodiment of the electromagnetic shield 618 includes three walls 634, 636, 638, each including one or more electrically conductive anchors 640 for anchoring the shield 618 to a printed circuit board (e.g., the printed circuit board 214 of FIG. 2). In this embodiment, a number of spring fingers 632 extend from the tops 630 of each of the three walls 634, 636, 638.

The spring fingers 632 shown in FIG. 6 are configured in substantially the same way as the spring fingers 532 of the electromagnetic shield 518 shown in FIG. 5. However, it is noted that any suitable type of spring fingers can be included on each of the three walls 634, 636, 638. In general, the decision as to whether one, two, or all three of the walls include spring fingers depends on factors such as the internal geometry of the housing, the geometry of the printed circuit board, etc.

In general, all of the embodiments shown in FIGS. 3-5 are configured to serve a number of purposes, including but not limited to: facilitating spraying of conformal coating of the printed circuit board 214, preventing application of excess torque to the printed circuit board 214, and establishing multiple points of contact with the inner surface of the top surface 226 of the housing 102.

4 Alternatives

In some examples, the housing is die cast from a material such as aluminum or magnesium.

In some examples, the electromagnetic shield is made of an electrically conductive material (e.g., sheet metal) which is stamped from a sheet and is then formed (e.g., bent) using a progressive die which includes a series of forming and trimming steps.

While the embodiments described above show spring fingers extending from only a single wall of the electromagnetic shield, it is noted that spring fingers can extend from any of the walls. In some examples, spring fingers extend from all of the walls.

In some examples, the spring fingers contact a surface other than the top surface of the housing. For example, the spring fingers may contact the side or bottom surfaces of the housing. In other examples, the housing may include ribs extending into the interior of the housing and making contact with the spring fingers.

In general, the spring fingers described above are configured such that an amount of overhang of the spring fingers over any portion of the printed circuit board is small enough to ensure that conformal coating can still be sprayed onto the printed circuit board in the area of overhang. This is possible since conformal coating can be sprayed from a spray nozzle that is configured to spray in a conical pattern. The spring fingers are disposed at a sufficient distance from the printed circuit board such that the conical spray can sufficiently fan out to completely coat the area of the printed circuit board under the overhang.

In general, all of the spring finger designs described above apply substantially similar amounts of contact pressure to the interior of the housing.

While a limited number of spring finger geometries are described above, it is noted that many different spring fingers geometries can be can be implemented, in particular, to satisfy geometric constraints within the housing due to factors such as printed circuit board/housing geometry, connector shape, etc.

In the above description, the walls of the electromagnetic shield are described as being perpendicular to one another. However, in some examples, the angles between one or more pairs of the walls of the electromagnetic shield are angles other than 90 degrees.

It is to be understood that the foregoing description is intended to illustrate and not to limit the scope of the invention, which is defined by the scope of the appended claims. Other embodiments are within the scope of the following claims.

What is claimed is:

1. An apparatus comprising:
   an electrically conductive housing including a first portion and second portion, the first portion including electronic circuitry;
   an electromagnetic shield separating the first portion and the second portion and configured to electromagnetically isolate the electronic circuitry of the first portion from the second portion, the electromagnetic shield including:
     a plurality of electrically conductive walls partially separating the first portion and the second portion;
     a plurality of electrically conductive spring loaded fingers extending from an end of at least one of the plurality of electrically conductive walls and configured to contact an inner surface of the housing;
     wherein together, the plurality of electrically conductive walls and the plurality of electrically conductive spring loaded fingers separate the first portion and the second portion.

2. The apparatus of claim 1 wherein the housing includes a connector wall including one or more openings between the second portion of the housing and an outside environment.

3. The apparatus of claim 2 wherein each of the plurality of electrically conductive spring fingers extends away from the connector wall of the housing at a predetermined angle, $\theta$.

4. The apparatus of claim 3 wherein at least a portion of each of the plurality of spring fingers protrudes into the first portion of the housing.

5. The apparatus of claim 2 wherein each of the plurality of electrically conductive spring fingers includes
   a first spring finger portion extending from the at least one electrically conductive wall in a direction away from the connector wall of the housing at a predetermined angle, $\theta_1$; and
   a second spring finger portion extending from an end of the first spring finger portion in a direction toward the connector wall of the housing at a predetermined angle, $\theta_2$.

6. The apparatus of claim 5 wherein a first portion of each of the plurality of spring fingers protrudes into the first portion of the housing by a predetermined amount and a second portion of each of the plurality of spring fingers protrudes into the second portion of the housing by a predetermined amount.

7. The apparatus of claim 2 wherein one or more electrical connectors extend from the second portion, through the openings in the connector wall of the housing and into the outside environment.

8. The apparatus of claim 2 wherein the plurality of electrically conductive walls of the electromagnetic shield includes a first wall facing the connector wall, a second wall extending perpendicularly from a first end of the first wall and toward the connector wall, and a third wall extending perpendicularly from a second end of the first wall and toward the connector wall.

9. The apparatus of claim 8 wherein the spring fingers extend from the first wall.

10. The apparatus of claim 9 wherein the spring fingers extend from the second wall.

11. The apparatus of claim 9 wherein the spring fingers extend from the third wall.

12. The apparatus of claim 8 wherein the spring fingers extend from the first, second, and third walls.

13. The apparatus of claim 1 wherein the spring loaded fingers have a serpentine cross-sectional shape.

14. The apparatus of claim 13 wherein a first portion of each of the plurality of spring fingers protrudes into the first portion of the housing by a predetermined amount and a second portion of each of the plurality of spring fingers protrudes into the second portion of the housing by a predetermined amount.

15. The apparatus of claim 1 wherein the electrically conductive housing houses a printed circuit board for supporting electronic circuitry.

16. The apparatus of claim 15 wherein the electromagnetic shield includes one or more electrically conductive anchors for anchoring the electromagnetic shield to the printed circuit board.

17. The apparatus of claim 15 wherein the spring loaded fingers are configured to reduce transmission of forces from the housing into the printed circuit board.

18. The apparatus of claim 1 wherein the second portion includes electronic circuitry.

* * * * *